United States Patent
Kesselring et al.

(10) Patent No.: US 9,264,052 B1
(45) Date of Patent: Feb. 16, 2016

(54) IMPLEMENTING DYNAMIC PHASE ERROR CORRECTION METHOD AND CIRCUIT FOR PHASE LOCKED LOOP (PLL)

(71) Applicant: International Business Machines Corporation, Armonk, NY (US)

(72) Inventors: Grant P. Kesselring, Rochester, MN (US); Christopher W. Steffen, Rochester, MN (US); James D. Strom, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/600,396

(22) Filed: Jan. 20, 2015

(51) Int. Cl.
*H03L 7/06* (2006.01)
*H03L 7/085* (2006.01)

(52) U.S. Cl.
CPC ..................................... *H03L 7/085* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 4,376,268 A | 3/1983 | Moriya et al. | |
| 4,677,648 A | 6/1987 | Zurfluh | |
| 5,815,016 A | 9/1998 | Erickson | |
| 6,229,774 B1 | 5/2001 | Yasuda | |
| 7,227,809 B2 | 6/2007 | Kwak | |
| 7,800,421 B2 | 9/2010 | Okuda et al. | |
| 8,121,237 B2 | 2/2012 | Stott et al. | |
| 8,259,888 B2 | 9/2012 | Hua et al. | |
| 2008/0157884 A1* | 7/2008 | Lee | H03L 7/1976 331/44 |
| 2013/0208776 A1* | 8/2013 | Svensson | H04B 17/004 375/224 |
| 2013/0268819 A1* | 10/2013 | Chae | G01R 31/31715 714/733 |
| 2015/0004919 A1* | 1/2015 | Ek | H04B 1/40 455/75 |
| 2015/0200677 A1* | 7/2015 | Ainspan | H03L 7/0992 327/158 |
| 2015/0213873 A1* | 7/2015 | Joo | G11C 11/4076 365/154 |
| 2015/0214966 A1* | 7/2015 | Tong | H03L 7/0898 327/157 |
| 2015/0222456 A1* | 8/2015 | Intrater | H04L 25/03178 375/227 |
| 2015/0256267 A1* | 9/2015 | Randel | H04B 10/6161 398/208 |

OTHER PUBLICATIONS

Yang et al., "Distributed Phase Correction Technique," IEEE 19th International Symposium on Asynchronous Circuits and Systems (ASYNC), 2013, pp. 91-98.
Johnson et al., "A Variable Delay Line PLL for CPU-Coprocessor Synchronization," IEEE Journal of Solid-State Circuits, vol. 23, No. 5, 1988, pp. 1218-1223.

* cited by examiner

*Primary Examiner* — Adam Houston
(74) *Attorney, Agent, or Firm* — Joan Pennington

(57) ABSTRACT

A method and a circuit for implementing dynamic phase error correction for phase locked loop (PLL) circuits, and a design structure on which the subject circuit resides are provided. The circuit implements dynamic phase error correction and includes an adjustable delay line that is placed in either the reference or feedback clock path. The phase error correction circuit detects the propagation delay of the reference clock path from input pin to the phase frequency detector in the PLL. It also detects the propagation delay of the feedback clock path from input pin to the phase frequency detector in the PLL. The detected propagation delays are compared and a control signal is generated that is proportional to the mismatch. The control signal is applied to the adjustable delay line. The delay of the delay line is continually adjusted until the reference and feedback clock paths are balanced.

15 Claims, 7 Drawing Sheets

IMPLEMENTING DYNAMIC PHASE ERROR CORRECTION METHOD AND CIRCUIT FOR PHASE LOCKED LOOP (PLL)

FIELD OF THE INVENTION

The present invention relates generally to the data processing field, and more particularly, relates to a method and a circuit for implementing dynamic phase error correction for phase locked loop (PLL) circuits, and a design structure on which the subject circuit resides.

DESCRIPTION OF THE RELATED ART

Phase locked loop (PLL) circuits are widely used in many different applications. FIG. 1 is a block diagram block diagram of a prior art phase locked loop (PLL) circuit.

Phase lock loops (PLLs) often are used in a system to synchronize two or more clock grids. Two or more clock grids are often synchronized by driving them with two or more PLLs that use a common reference clock. Since the PLL's outputs are phase aligned with their reference clocks, and since the same reference clock is used for all PLLs, the output clocks are phase aligned with each other. This only holds true if the internal path delay in the PLL from the reference clock input pin to the phase frequency detector (PFD) is matched with the delay from the external feedback clock pin to the PFD for all PLL's. Matching these delays in each PLL can be difficult because they are not always the exact same type of PLL. For example, one PLL may be a digital PLL used to drive a nest grid while another PLL may be an LC tank PLL used to drive a bus grid for off-chip communication. Due to different reference clock requirements, one PLL might receive a version of the reference clock (refclk) that is complementary metal oxide semiconductor (CMOS) signals while the other receives a version of the refclk that is current mode logic (CML). These differences can drive different delays inside the PLL and end up causing skew between the two PLL outputs.

A way of making sure that the PLL outputs are synchronized, is to design each PLL so that there is no phase error between the reference (ref) and feedback clock (fb clk) paths. It is difficult to properly pad the reference and feedback paths for zero phase error because the path delays change if different refclk or fbclk divide values are chosen. Also, the path delays might be matched at a certain temperature, but that temperature may drift over time which could cause the path delays to mistrack.

A mechanism is required to dynamically adjust the delay of either the reference and feedback clock paths so the paths are always balanced.

SUMMARY OF THE INVENTION

Principal aspects of the present invention are to provide a method and a circuit for implementing dynamic phase error correction for phase locked loop (PLL) circuits, and a design structure on which the subject circuit resides. Other important aspects of the present invention are to provide such method and circuit substantially without negative effects and that overcome some disadvantages of prior art arrangements.

In brief, a method and a circuit for implementing dynamic phase error correction for phase locked loop (PLL) circuits, and a design structure on which the subject circuit resides are provided. The circuit implements dynamic phase error correction and includes an adjustable delay line that is placed in either the reference or feedback clock path. The phase error correction circuit detects the propagation delay of the reference clock path from input pin to the phase frequency detector in the PLL. It also detects the propagation delay of the feedback clock path from input pin to the phase frequency detector in the PLL. The detected propagation delays are compared and a control signal is generated that is proportional to the mismatch. The control signal is applied to the adjustable delay line. The delay of the delay line is continually adjusted until the reference and feedback clock paths are balanced.

In accordance with features of the invention, the phase error correction circuit includes two phase detectors, a charge pump, a loop filter, and a feedback control signal to a voltage controlled delay line.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and a circuit for implementing dynamic phase error correction for phase locked loop (PLL) circuits, and a design structure on which the subject circuit resides are provided. The circuit implements dynamic phase error correction and includes an adjustable delay line.

Figure 1:
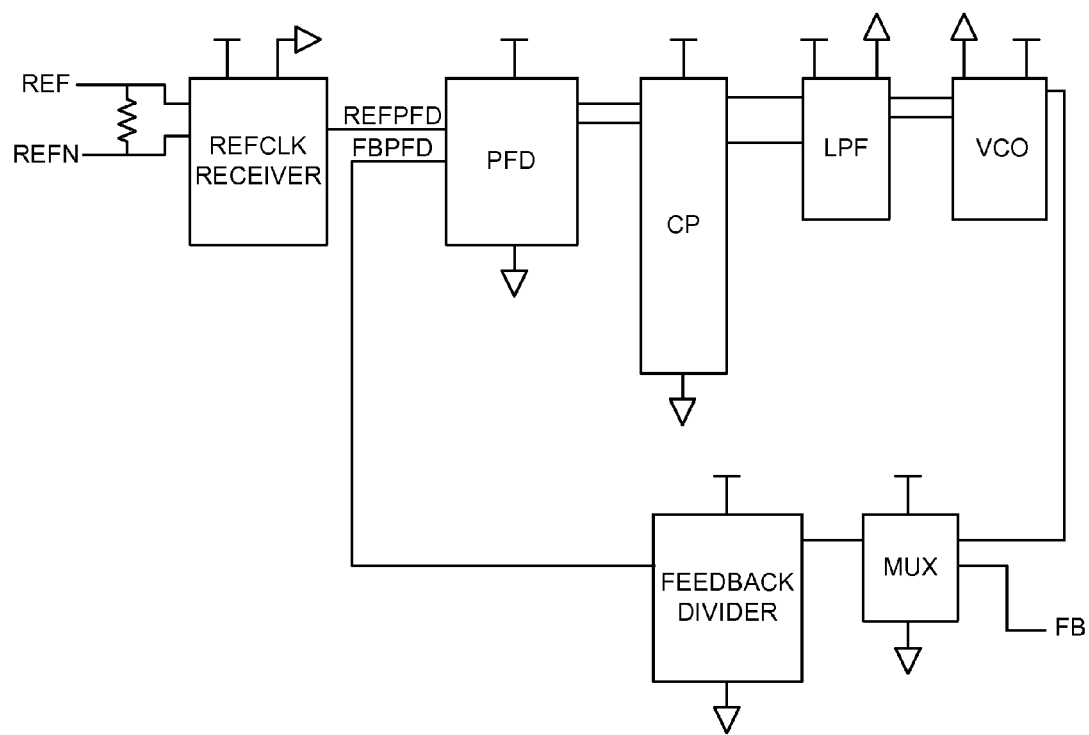
FIG. 1 is a block diagram block diagram of a prior art phase locked loop (PLL) circuit.
Figure 2:
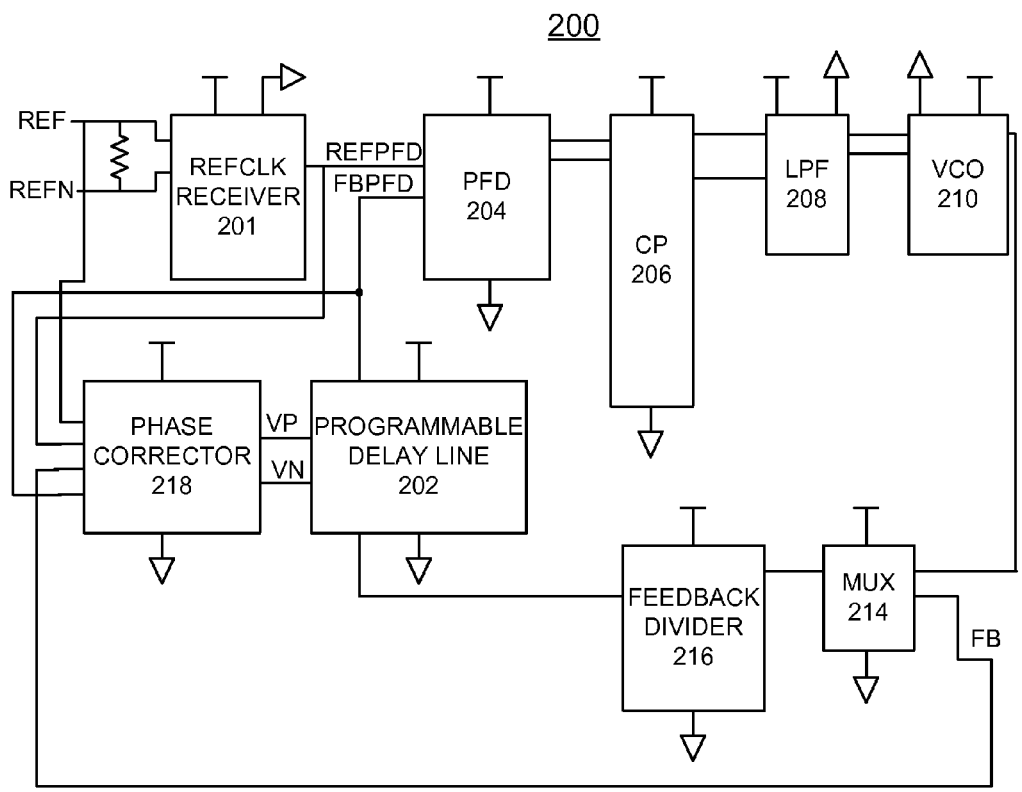
FIG. 2 is a block diagram of an example phase locked loop (PLL) circuit with phase correction in accordance with preferred embodiments.

Having reference now to the drawings, in FIG. 2, there is shown an example phase locked loop (PLL) circuit with phase correction in accordance with preferred embodiments generally designated by the reference character 200. Circuit 200 including a controllable delay line 202 in accordance with preferred embodiments.

As shown, the PLL phase correction circuit 200 includes a reference clock receiver 201, a phase frequency detector (PFD) 204, a charge pump (CP) 206, a low pass filter (LPF) 208, a voltage controlled oscillator (VCO) 210, for example a 3 stage VCO 210, a multiplexer 214, a feedback divider 216 coupled to the programmable delay line 202, and a phase corrector 218.

In accordance with features of the invention, the PLL phase corrector circuit 218 detects a propagation delay of the reference clock path from input pin to a phase frequency detector (PFD) 204 in the PLL. The PLL phase corrector circuit 218 also detects a propagation delay of the feedback clock path from input pin (the pin is called FB) to the phase frequency detector 204 in the PLL. These two delays are compared and a control signal is generated that is proportional to the mismatch. The control signal is then fed back to the adjustable delay line 202 that is placed in either the reference or feedback path. The delay of the delay line is continually adjusted until the reference and feedback paths are balanced.

Figure 3:
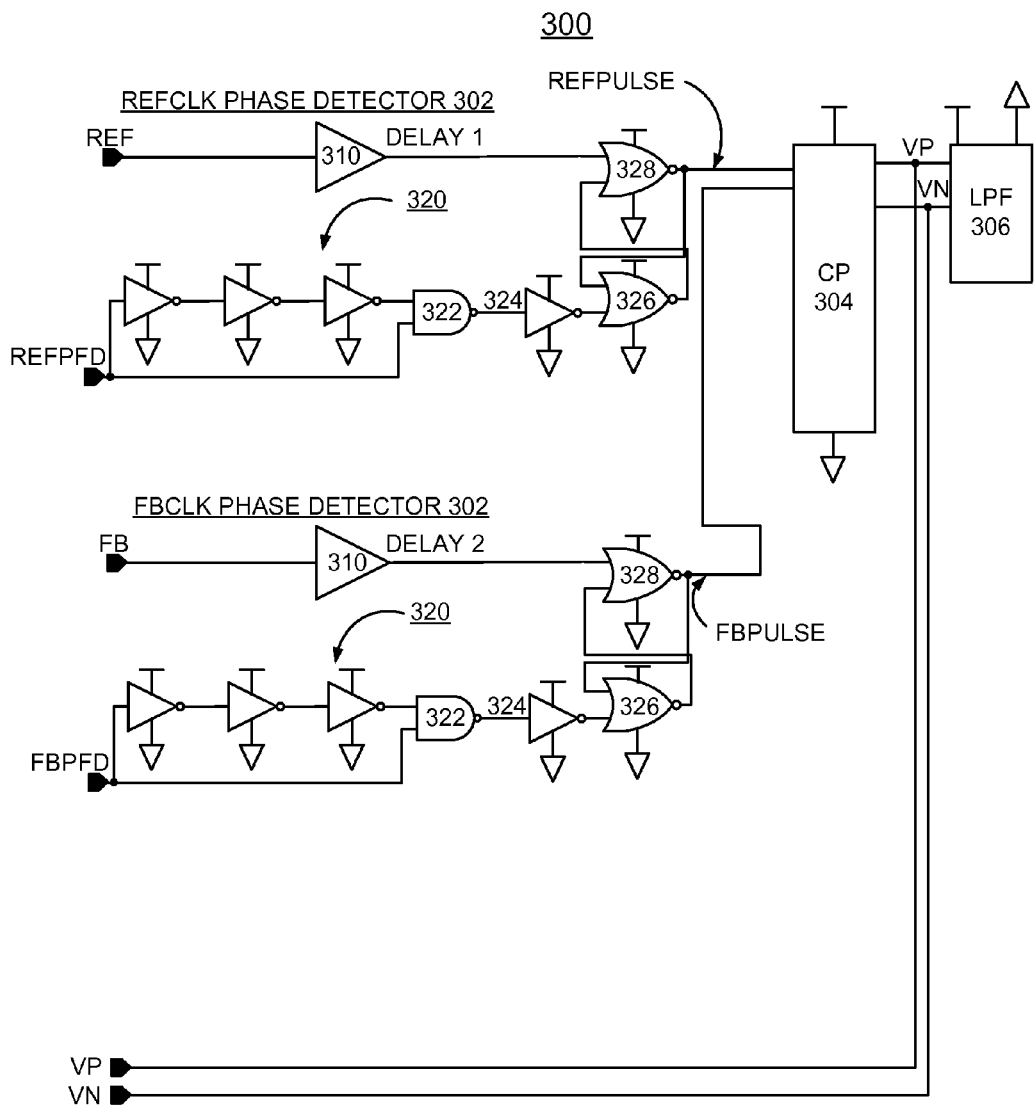
FIG. 3 is a schematic and block diagram of an example phase corrector circuit in accordance with preferred embodiments.

Referring also to FIG. 3, there is shown an example phase error correction circuit generally designated by the reference character 300 in accordance with preferred embodiments. Phase correction circuit 300 includes two phase detectors 302, a charge pump (CP) 304, a loop filter or low pass filter (LPF) 306, and a feedback control signal to a voltage controlled delay line. The first phase detector 302 generates a pulse signal at the node REFPULSE. The pulsewidth of this REFPULSE signal is proportional to the propagation path delay from REF to REFPFD. The second phase detector generates a pulse signal at the node FBPULSE. The pulsewidth of this FBPULSE signal is proportional to the propagation path delay from FB to FBPFD. The charge pump (CP) 304 receives the REFPULSE and FBPULSE signals and generates a control voltage (VP,VN) in response. The control voltage is fed back to a voltage controlled delay line 202 in the FB clock path.

Delay elements 310, DELAY1 and DELAY2 are required when the PLL reference and/or feedback paths include a frequency divider 216. The reason is clear when looking at the timing diagrams of FIGS. 5 and 6. The signal FB is the clock signal applied to phase corrector 218 and multiplexer 214 before the divider 216 and signal FBPFD is after the divider applied to the PFD 204. It is not possible to measure the path delay from FB to FBPFD without knowing which rising edge of FB actually caused the FBPFD rising edge. A delayed version of FB must be generated (FBDLY) which occurs after the FBPFD edge. Delay elements 310, DELAY1 and DELAY2 must be identical. Phase correction circuit 300 includes a respective delay chain generally designated by the reference character 320 in the feedback path and in the reference clock path. The respective delay chain 320 output and respective delay elements 310, DELAY1 and DELAY2 output are coupled by logic gates NAND 322, inverter 234, a pair of NOR gates 326, 328 to the CP 304.

REFPULSE and FBPULSE are fed into the charge-pump (CP) 304. When REFPULSE pulsewidth is larger than FBPULSE, the CP 304 will charge the filter 308 and the control voltage will increase. When REFPULSE pulsewidth is smaller than FBPULSE, the CP 304 will discharge the filter 306 and the control voltage will decrease. The CP output voltages (VP,VN) react in a way so as to increase or decrease the feedback path to match the REFCLK path. The drive voltage VP,VN controls the programmable delay line 202 in FIG. 2.

When the reference clock path delay and the feedback clock path delays are equal, the pulsewidths of REFPULSE and FBPULSE will be equal and the CP 304 will not make any further adjustments to the control voltage. The programmable delay line 202 will maintain the precise amount of delay required to keep the FB path delay equal to the REF path delay.

Figure 4:
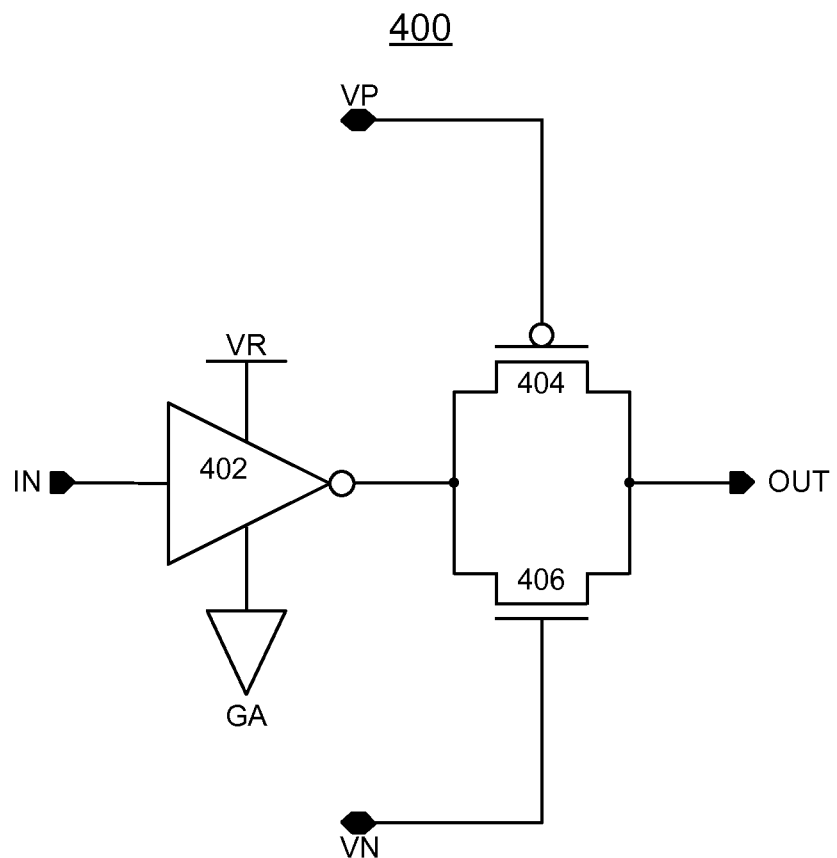
FIG. 4 is a schematic and block diagram of an example delay line function in accordance with preferred embodiments.

Referring also to FIG. 4, there is shown an example delay line function generally designated by the reference character 400 in accordance with preferred embodiments. The delay line function 400 includes an inverter 402 receiving an input IN and providing an output coupled to a common connection of a P-channel field effect transistor (PFET) 404 and an N-channel field effect transistor (NFET) 406. The PFET 404 receives a gate input VP and the NFET 406 receives a gate input VN. The PFET 404 and NFET 406 provide a delay line output OUT. Multiple delay line functions 400 are connected together in series to form a delay of any desired amount. The delay through the chain is adjusted according to the control voltages VP, VN.

Figure 5:
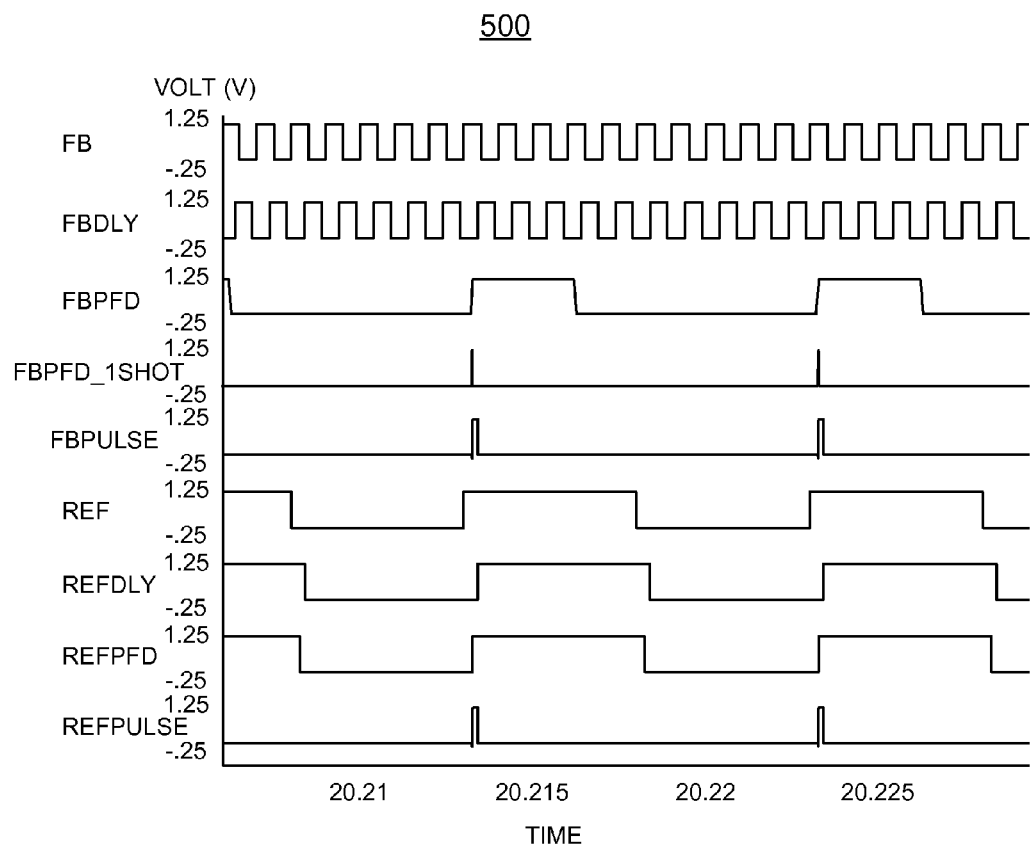
FIGS. 5 and 6 are timing diagrams illustrating example operation of the phase locked loop (PLL) circuit with phase correction of FIG. 2 in accordance with preferred embodiments.
Figure 6:
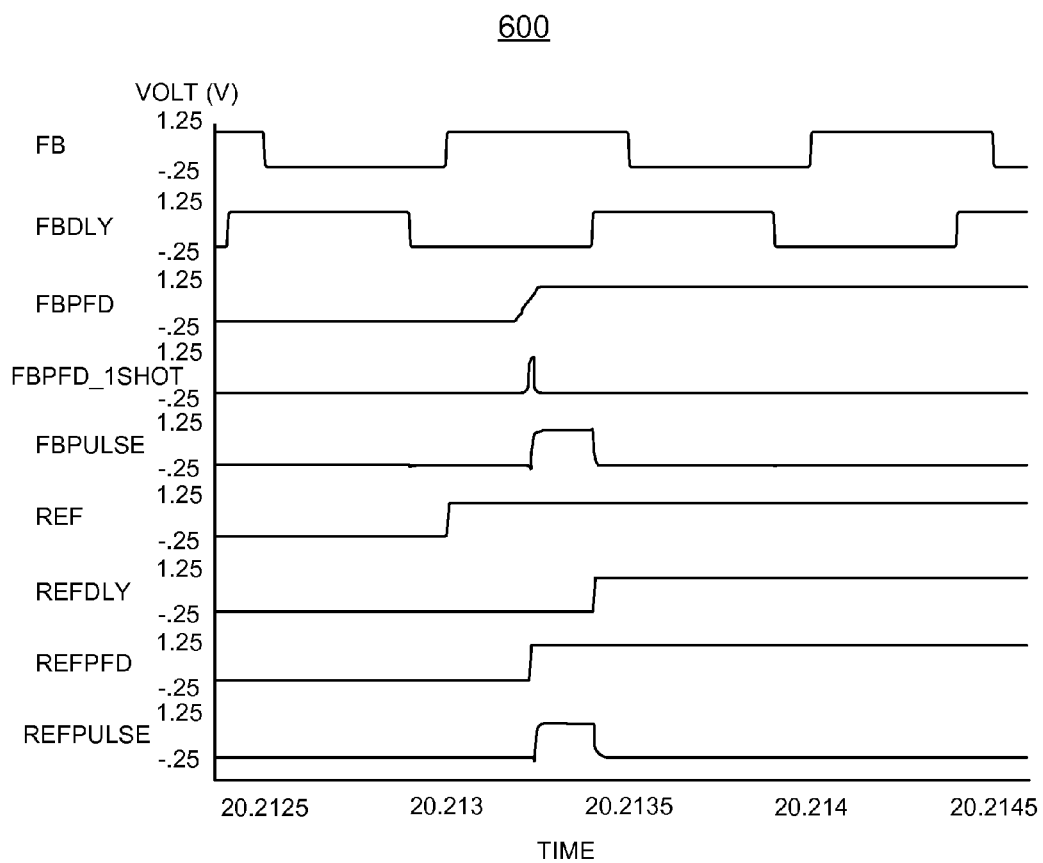

Referring also FIGS. 5 and 6, there are shown timing diagrams generally designated by the reference characters 500, 600 illustrating example operation of the phase locked loop (PLL) circuit 200 with phase correction circuit 300 of FIGS. 2 and 3 in accordance with preferred embodiments, and programmable delay 400 of FIG. 4. FIG. 6 illustrates the operations of FIG. 5 zoomed in on the rising edge of REF.

A general flow of operational steps follows:
1) Capture rising edge arrival time of FB, FBPFD, REF, and REFPFD.
2) Generate pulse that has pulsewidth proportional to FB→FBPFD rise-rise propagation delay.
3) Generate pulse that has pulsewidth proportional to REF→REFPFD rise-rise propagation delay.
4) Compare generated pulses in step 2 and 3. If step 2 pulsewidth is greater than step 3 pulsewidth, decrease a control voltage (VP lower,VN higher). If step 2 pulsewidth is less than step 3 pulsewidth, increase a control voltage (VP higher, VN lower).
5) Apply control voltage to a programmable delay line inserted into one of the paths.

Figure 7:
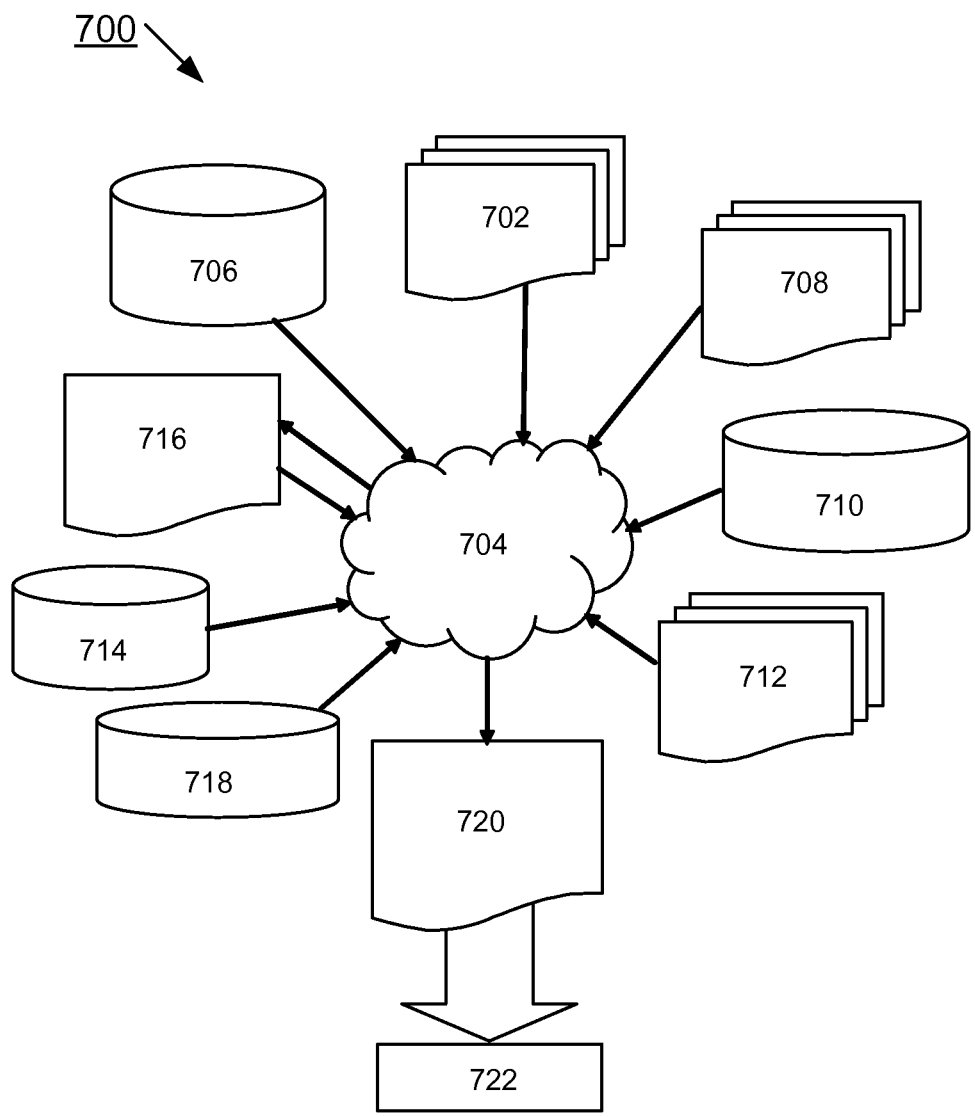
FIG. 7 is a flow diagram of a design process used in semiconductor design, manufacturing, and/or test.

FIG. 7 shows a block diagram of an example design flow 700. Design flow 700 may vary depending on the type of IC being designed. For example, a design flow 700 for building an application specific IC (ASIC) may differ from a design flow 700 for designing a standard component. Design structure 702 is preferably an input to a design process 704 and may come from an IP provider, a core developer, or other design company or may be generated by the operator of the design flow, or from other sources. Design structure 702 comprises circuits 200, 300, 400 in the form of schematics or HDL, a hardware-description language, for example, Verilog, VHDL, C, and the like. Design structure 702 may be contained on one or more machine readable medium. For example, design structure 702 may be a text file or a graphical representation of circuits 200, 300, 400. Design process 704 preferably synthesizes, or translates, circuits 200, 300, 400 into a netlist 706, where netlist 706 is, for example, a list of wires, transistors, logic gates, control circuits, I/O, models, etc. that describes the connections to other elements and circuits in an integrated circuit design and recorded on at least one of machine readable medium. This may be an iterative process in which netlist 706 is resynthesized one or more times depending on design specifications and parameters for the circuits.

Design process 704 may include using a variety of inputs; for example, inputs from library elements 707 which may house a set of commonly used elements, circuits, and devices, including models, layouts, and symbolic representations, for a given manufacturing technology, such as different technology nodes, 14 nm, 22 nm, 32 nm, 45 nm, 90 nm, and the like, design specifications 710, characterization data 712, verification data 714, design rules 716, and test data files 717, which may include test patterns and other testing information. Design process 704 may further include, for example, standard circuit design processes such as timing analysis, verification, design rule checking, place and route operations, and the like. One of ordinary skill in the art of integrated circuit design can appreciate the extent of possible electronic design automation tools and applications used in design process 704 without deviating from the scope and spirit of the invention. The design structure of the invention is not limited to any specific design flow.

Design process 704 preferably translates an embodiment of the invention as shown in FIGS. 2, 3, 4 along with any additional integrated circuit design or data (if applicable), into a second design structure 720. Design structure 720 resides on a storage medium in a data format used for the exchange of layout data of integrated circuits, for example, information stored in a GDSII (GDS2), GL1, OASIS, or any other suitable format for storing such design structures. Design structure 720 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 2, 3, 4. Design structure 720 may then proceed to a stage 722 where, for example, design structure 720 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing dynamic phase error correction for a phase locked loop (PLL) comprising:
   providing a phase error correction circuit including an adjustable delay line placed in one of a reference clock path or a feedback clock path;
   said phase error correction circuit,
   detecting a propagation delay of a reference clock path from input pin to a phase frequency detector in the PLL;
   detecting a propagation delay of a feedback clock path from input pin to a phase frequency detector in the PLL;
   comparing the detected propagation delays and generating a control signal proportional to a mismatch;
   applying the generated control signal to the adjustable delay line, and continually adjusting a delay of the adjustable delay line until the reference and feedback paths are balanced.

2. The method as recited in claim 1 wherein providing a phase error correction circuit including an adjustable delay line placed in one of a reference path or a feedback path includes providing a voltage controlled delay line.

3. The method as recited in claim 2 wherein comparing the detected propagation delays and generating a control signal proportional to a mismatch includes providing a charge pump receiving the detected propagation delays and said charge pump generating a control voltage signal responsive to the received detected propagation delays.

4. The method as recited in claim 3 wherein said charge pump couples the generated control voltage signal to the voltage controlled delay line.

5. A circuit for implementing dynamic phase error correction for a phase locked loop (PLL) comprising:
   a phase error correction circuit including an adjustable delay line placed in one of a reference clock path or a feedback clock path;
   said phase error correction circuit including
   a first phase detector detecting a propagation delay of a reference clock path from input pin to a phase frequency detector in the PLL;
   a second phase detector detecting a propagation delay of a feedback clock path from input pin to a phase frequency detector in the PLL;
   a charge pump comparing the detected propagation delays and generating a control signal proportional to a mismatch;
   said charge pump coupling the generated control signal to said adjustable delay line, and continually adjusting a delay of the adjustable delay line until the reference and feedback paths are balanced.

6. The circuit as recited in claim 5 wherein said phase error correction circuit including said adjustable delay line placed in one of a reference clock path or a feedback clock path includes a voltage controlled delay line.

7. The circuit as recited in claim 6 wherein said charge pump comparing the detected propagation delays and generating a control signal proportional to a mismatch includes a charge pump receiving the detected propagation delays and said charge pump generating a control voltage signal responsive to the received detected propagation delays.

8. The circuit as recited in claim 7 wherein said charge pump couples the generated control voltage signal to the voltage controlled delay line.

9. A design structure embodied in a machine readable medium used in a design process, the design structure comprising:
   a circuit tangibly embodied in the machine readable medium used in the design process, said circuit for implementing dynamic phase error correction for a phase locked loop (PLL), said circuit comprising:
   a phase error correction circuit including an adjustable delay line placed in one of a reference clock path or a feedback clock path;
   said phase error correction circuit including
   a first phase detector detecting a propagation delay of a reference clock path from input pin to a phase frequency detector in the PLL;
   a second phase detector detecting a propagation delay of a feedback clock path from input pin to a phase frequency detector in the PLL;
   a charge pump comparing the detected propagation delays and generating a control signal proportional to a mismatch;
   said charge pump coupling the generated control signal to said adjustable delay line, and continually adjusting a delay of the adjustable delay line until the reference and feedback paths are balanced, wherein the design structure, when read and used in the manufacture of a semiconductor chip produces a chip comprising said circuit.

10. The design structure of claim 9, wherein the design structure comprises a netlist, which describes said PLL circuit.

11. The design structure of claim 9, wherein the design structure resides on storage medium as a data format used for the exchange of layout data of integrated circuits.

12. The design structure of claim 9, wherein the design structure includes at least one of test data files, characterization data, verification data, or design specifications.

13. The design structure of claim 9, wherein said phase error correction circuit including said adjustable delay line placed in one of a reference clock path or a feedback clock path includes a voltage controlled delay line.

14. The design structure of claim 9, wherein said charge pump generating a control voltage signal responsive to the received detected propagation delays.

15. The design structure of claim 14, wherein said charge pump couples the generated control voltage signal to the voltage controlled delay line.

* * * * *